US008022595B2

(12) United States Patent
Andle et al.

(10) Patent No.: US 8,022,595 B2
(45) Date of Patent: Sep. 20, 2011

(54) ASYMMETRIC COMPOSITE ACOUSTIC WAVE SENSOR

(75) Inventors: Jeffrey C Andle, Falmouth, ME (US); Reichl B Haskell, Nashua, NH (US)

(73) Assignee: Delaware Capital Formation, Inc., Wilmington, DE (US)

( * ) Notice: Subject to any disclaimer, the term of this patent is extended or adjusted under 35 U.S.C. 154(b) by 466 days.

(21) Appl. No.: 12/202,431

(22) Filed: Sep. 2, 2008

(65) Prior Publication Data

US 2010/0052470 A1 Mar. 4, 2010

(51) Int. Cl.
*H01L 41/08* (2006.01)

(52) U.S. Cl. ......................... 310/322; 310/321; 310/334

(58) Field of Classification Search ........... 310/334–337
See application file for complete search history.

(56) References Cited

U.S. PATENT DOCUMENTS

| | | | | |
|---|---|---|---|---|
| 4,535,631 | A | 8/1985 | Sinha et al. | |
| 4,800,316 | A * | 1/1989 | Ju-Zhen | 310/327 |
| 5,565,724 | A | 10/1996 | Hachigo et al. | |
| 5,877,581 | A | 3/1999 | Inoi et al. | |
| 6,082,178 | A | 7/2000 | Bernstein et al. | |
| 6,567,753 | B2 | 5/2003 | Potyrailo | |
| 6,745,626 | B2 | 6/2004 | Usui et al. | |
| 6,788,620 | B2 * | 9/2004 | Shiraishi et al. | 367/152 |
| 6,842,009 | B2 | 1/2005 | Potter | |
| 6,969,943 | B2 * | 11/2005 | Hashimoto et al. | 310/334 |
| 6,989,625 | B2 * | 1/2006 | Suzuki et al. | 310/334 |
| 7,061,163 | B2 * | 6/2006 | Nagahara et al. | 310/334 |
| 7,696,672 | B2 * | 4/2010 | Sugiura et al. | 310/334 |
| 2006/0244346 | A1 | 11/2006 | Iwata | |
| 2008/0100176 | A1 | 5/2008 | Haskell et al. | |

FOREIGN PATENT DOCUMENTS

| | | |
|---|---|---|
| DE | 4312887 | 11/1993 |
| WO | WO2007123537 | 11/2007 |

OTHER PUBLICATIONS

"The Characterization of Permanent Acoustic Bonding Agents" Fred S. Hickernell (University of Arizona, Tucson, Arizona, USA, University of Central Florida, Orlando, FL, USA) 2008 IEEE Frequency Control Symposium Proceedings (in press).

"Thin Film Shear Modulus Determination With Quartz Crystal Resonators: A Review", Ralf Lucklum, Peter Hauptmann, 2001 IEEE International Frequency Control Symposium and PDA Exhibition, Copyright 2001 IEEE.

(Continued)

*Primary Examiner* — Mark Budd
(74) *Attorney, Agent, or Firm* — Shalom Wertsberger; Saltamar Innovations

(57) ABSTRACT

A composite acoustic wave device provides improved protection from environmental factors while maintaining high electrical characteristics and dynamic range is provided. The device comprises a rigid protector plate having high quality acoustical characteristics and a thickness which is a multiple of half wavelength of the resonant frequency. A piezoelectric plate is coupled to the protector plate, is supported therefrom, and forms an energy interface therewith. The piezoelectric and protector plates are dimensioned such that a wave of resonant frequency traveling between the excitation face and the loaded/sensing face, forms a substantially continuous-phase wave, at substantially peak amplitude, at the energy interface. By doing so the device decouples the electrical thickness of the wave device from the mechanical thickness thereof.

22 Claims, 3 Drawing Sheets

OTHER PUBLICATIONS

PMMA Polymer Film Characterization Using Thickness-Shear Mode (TSM) Quartz Resonator, Boima Morray, Suiqiong Li, Jeanne Hossenlopp, Richard Cernosek, and Fabien Josse, 2002 IEEE International Frequency Control Symposium and PDA Exhibition, copyright 2002 IEEE.
"Measurement of the Equivalent Circuit Parameters of Chemical Interface Layers on Bulk Acoustic Wave Resonators", G.J. Gouws, R.C. Holt and J Zhen, Proceedings of the 2004 IEEE International Frequency Control Symposium and Exposition, copyright 2004 IEEE.
"Comparison of Lumped-Element and Transmission-Line Models for Thickness-Shear-Mode Quartz Resonator Sensors", R. W. Cemosekt, S. J. Martin, A. R. Hillmad, and H. L. Bandeys, 1997 IEEE International Frequency Control Symposium, copyright 1997 IEEE.

* cited by examiner

ASYMMETRIC COMPOSITE ACOUSTIC WAVE SENSOR

FIELD OF THE INVENTION

The present invention relates generally to acoustic wave sensors, and more particularly to a hybrid acoustic wave sensors for operation at harsh and or high baric difference environments.

BACKGROUND OF THE INVENTION

Piezoelectric sensors are well known. They are used for sensing material properties such as viscosity and density, for detecting the presence of certain materials in an environment, for measuring purity of fluid substance, and the like. Structures known for acoustic sensing range from the simple crystal resonator, crystal filters, acoustic plate mode devices, Lamb wave devices, and the like. Briefly, these devices comprise a substrate of piezoelectric material such as quartz, langasite or lithium niobate, or thin films of piezoelectric material, such as aluminum nitride, zinc oxide, or cadmium sulfide, on a non-piezoelectric substrate. The substrate has at least one active piezoelectric surface area, which in most cases is highly polished. Formed on the surface are input and output transducers for the purpose of converting input electrical energy to acoustic energy within the substrate and reconverting the acoustic energy to an electric output signal. These transducers may consist of parallel plate and co-planar plate (bulk-generated acoustic wave) or periodic interdigitated (surface-generated acoustic wave) transducers. It is noted that a single transducer may act both as the input and the output transducer.

Piezoelectric materials interconvert electrical and mechanical signals and energy, allowing an electrical circuit to be responsive to a physical effect on the mechanical properties of a vibrating system. The literature presents countless instances of detecting temperature, pressure, added mass, viscoelastic variations, magnetic fields and the like using these sensors. The interactions between the devices and the electronic circuits have historically included the response of the device's phase or amplitude at a given frequency and changes in the resonant frequency or damping of a natural resonant mode of the device. Both phase delay and resonant frequency can be employed to create an oscillator circuit, ultimately providing frequency change as the circuit response to ambient physical influences.

Piezoelectric sensors can be designed to operate while being fully immersed in fluid. However the sensitive electronics are then subjected to, in the least, noise signals and reading errors and, in the extreme, to corrosion or even explosive hazards. Passivation of the electronics surface is well known and is suitable in some limited applications, as seen for the Love Wave and surface transverse wave (STW) sensors. However passivation is not complete and electrical components of the circuit are still exposed to capacitive loading and noise injection. Moreover, most passivation methods require the use of material having poor acoustic characteristics compared to single crystal materials. Finally, these passivated surface wave based sensors exhibit undesirably high shear rate for many liquid phase measurements. While such sensors potentially address many sensor applications, they are not ideal, for instance, in measuring fluids in oil production, especially in down-well environments.

More preferably the frequency of measurement is maintained below approximately 10 MHz and the preferred geometries employ the thickness of the piezoelectric plate to form a waveguide.

In most applications only the surface opposite the transducers is in direct or indirect contact with the fluid being measured and interfaces acoustic energy to and from it. In addition to the interface function, the piezoelectric material forms a protective membrane between the fluid and a cavity containing electrical components of the sensor.

As the cavity behind the piezoelectric plate material is commonly not pressurized to the same level of the fluid, the piezoelectric plate acts as a membrane between the high and low pressure environments, and is exposed to the pressure difference between the fluid and the pressure within the cavity. Therefore, the finite strength of the material limits the operating pressure to which the sensor may be exposed. Even if the material is sufficiently strong to withstand the pressure, the nonlinear effect on the sensor of membrane flexure will severely affect the sensor characteristics.

As increasing material thickness increases the membrane strength, a simple solution will be to increase the thickness of the piezoelectric membrane. This however suffers from reduced acoustic coupling, reduced efficiency and dynamic range, and other disadvantages, whether the piezoelectric material is operated at fundamental or at overtone operating mode.

Yet another disadvantage of the present piezoelectric sensors is lack of resistance to harsh chemicals, abrasion, and the like. Thus for example, an excellent piezoelectric material such as langasite will deteriorate in certain acidic environments and other piezoelectric materials such as lithium tetraborate are water soluble.

In PCT application No. PCT/US06/15510 to Andle, I disclosed a composite acoustic wave device (AWD) which is adapted for operation at high ambient pressures. The AWD comprises two piezoelectric plates in a symmetric back to back relationship, with electrodes disposed between the plates. The plates are bonded so as to neutralize the effects of external pressure, which is isobaric under immersion. This application is incorporated herein by reference in its entirety.

Several devices are reported in the literature, such as "Measurement of the equivalent circuit parameters of chemical interface layers on bulk acoustic wave resonator" by G J Gouws, R. C. Holt, and J Zhen, Proceedings of the 2004 IEEE International Frequency Control Symposium and exposition, "PMMA polymer film characterization using thickness-shear mode (TSM) quartz resonator" by Boima Morray, Suiqiong Ii, Jeanne Hossenlopp, Richard Cernosek, and Fabien Josse, 2002 IEEE International Frequency Control Symposium and exposition, and others. Those devices add a layer of polymer, or metal deposited by thin or thick film technologies to the exposed sensing surface. In some cases such layers may be a quarter or even half wavelength thick. In such devices, the lateral extent of the added layer is limited by the piezoelectric plate size, and does not support the piezoelectric, but is rather supported therefrom. Thus film deposition methods do not provide additional resistance to pressure or encapsulation from environmental damage.

A high overtone bulk acoustic resonator, also known as HBAR, is a compressional wave device, comprising a piezoelectric layer grown on the end of a sapphire or garnet rod of a large number (at least over 100) of half wavelengths in length. An intentional acoustic mismatch between the sapphire and the piezoelectric plate allows the device to have a very high reflection of the energy trapped therein, and thus generate a number of extremely sharp transfer peaks. The sharp transfer peaks allow the HBAR to act as an extremely high Q filter. However, the weak acoustic coupling and the compressional wave operation mode make the device ill suited for liquid-phase sensor duty, which requires a shear wave. Furthermore to obtain a highly responsive electrical response to a mechanical effect requires as tight coupling as possible to work efficiently. Furthermore, as will be seen infra, unlike the HBAR, the present invention attempts to minimize wave reflection at the energy interface, while the HBAR attempts to maximize such reflection in order to generate the high Q, multiple mode operation. The present invention is generally directed to a narrow band, frequency selective, and resonant finite impulse device, while the HBAR is directed to a compressional wave, multiple frequency device.

Many technology areas may benefit from measuring fluid with low sensitivity to pressure variations or at high pressure levels, as well as providing for harsh chemical or abrasive materials. Examples of such technologies include by way of a non-limiting example, gas production, oil well and oil pipes, hydraulic systems, in-service lubricant monitoring, injection molding equipment, anti terror detection system for detection of biological and chemical substances, and the like. Therefore there is a long felt and heretofore unanswered need in the industry for an electro acoustic sensor, which in various embodiments is capable of operating with low sensitivity to pressure variations, in high ambient pressure environments, and/or in harsh chemical or abrasive environments. The present invention aims to provide a solution to any single one of the above conditions, or to any combination thereof.

SUMMARY OF THE INVENTION

It is therefore an object of the present invention to provide a thick piezoelectric composite acoustic wave device having improved coupling for operation in overtone mode, while still providing improved responsiveness to a physical measurand with high dynamic range.

It is a further object of the present invention to provide an improved hermetic packaging solution for a high pressure acoustic wave device based sensor.

It is yet another object of the present invention to provide a sensor which may operate efficiently in hostile environments such as high pressure, and reactive ambient conditions.

In order to provide an Acoustic Wave Device (AWD) based sensor capable of handling harsh environments such as high pressure or chemically reactive environments it is desirable to increase the mechanical thickness of the device, while maintaining the desired electrical characteristics of the device.

To that end, in its simplest form, the invention provides a composite structure comprising a rigid structural element (a protector plate hereinafter), coupled to a piezoelectric plate, so as to provide continuous mechanical displacement amplitude, phase and stress relationship at the energy interface formed therebetween. By selecting specific materials and dimensioning those materials in accordance with the principles disclosed herein, a resonant frequency wave imparted to one side of the composite structure, shall travel to the other side and back with minimal energy loss, without presenting undue mechanical stresses to any joining interfaces, and with good acoustic coupling of the wave properties to the conditions on the other side. Doing so will allow the composite to present the electrical efficiency of fundamental-mode oscillatory operation, without suffering from the disadvantages of a thick piezoelectric plate while exhibiting the mechanical toughness of a thick plate. To that end there is provided a composite acoustic wave device having a target resonant frequency, associated with a selected polarization of acoustic displacement. The device comprises a rigid protector plate mounted to a mechanical mount, the protector plate comprising a material having high quality acoustical characteristics. The protector plate has a driven face and a sensing face, and further has a thickness which is substantially a multiple of half wavelength of said resonant frequency. A piezoelectric plate having a thickness of substantially a multiple of half wavelength of the resonant frequency in the plate is further provided. The piezoelectric plate has an excitation face having at least one transducer electrode deposited thereupon, which together with at least one other electrode form a transducer interconverting electrical and acoustical energy within the piezoelectric plate. The piezoelectric plate is supported from the protector plate. An energy interface is formed between the driven face and a driving face of said piezoelectric plate, such that a wave of said resonant frequency traveling between the excitation face and the sensing face, shall form a substantially continuous-phase wave, at substantially peak displacement amplitude, at the energy interface.

Preferably, the piezoelectric plate has a thickness of substantially one half wavelength of said resonant frequency. Also preferably, the protector plate is made of material selected from a group consisting of Zirconium, Zirconium alloys, aluminum, aluminum alloys, niobium, niobium alloys, vanadium, and vanadium alloys.

In a preferred embodiment, the selected acoustic displacements are tangential to the sensing surface.

Furthermore, the protector plate may comprise one or more layers or regions made of an alloy having at least 50% zirconium, and wherein the piezoelectric plate comprises material selected from a group consisting of LGS, LGN, LGT, CNGS, CTGS, SNGS, STGS, CTAS, CNAS, and any combination thereof.

Furthermore, the protector plate may comprises one or more layers or regions consisting of a zirconium alloy having between 0 and 10% niobium and between 0 and 10% hafnium.

In one embodiment, the protector plate comprises aluminum, and said piezoelectric plate comprises quartz.

Preferably, the acoustic impedance of said supporting plate and said piezoelectric plate is sufficiently matched so as to allow a reflection coefficient of less than 10% at the energy interface.

Furthermore, a bonding layer may be disposed between the protector plate and the piezoelectric plate.

Furthermore, a composite acoustic wave device as described is contemplated wherein protector plate comprises a composite of a plurality of materials. Such composite may be made of discrete material layers or a continuously variable material, generally referred to hereinunder as a functionally graded material. Thus by way of example there is provided a composite acoustic wave device wherein the protector plate comprises one or more layers or regions consisting of an alloy consisting of at least 50% in the aggregate of niobium and vanadium, and wherein piezoelectric plate comprises material selected from a group consisting of LGS, LGN, LGT, CNGS, CTGS, SNGS, STGS, CTAS, CNAS, and any combination thereof. Yet another example for a composite material protector plate comprises an alloy or mixture continuously varied from one composition (e.g. zirconium) to another (e.g. titanium). In the case of functionally graded and multi-layered waveguides, well known transmission line theory allows for the calculation of the reflection coefficient of the composite protector plate.

Preferably, the device has peak displacement amplitude within $\lambda/12$ from energy interface, where $\lambda$ is the local acoustic wavelength. More preferably, the peak displacement amplitude is within λ/24 from the energy interface. Further, it is preferred that the acoustic impedance of the protector plate and the piezoelectric plate are sufficiently matched so as to allow a reflection coefficient of less than 10% at the energy interface.

In another aspect of the present invention there is provided an electronic package for placing a sensor in harsh environments, the package comprising a base having a welding flange, and at least one electrical feedthrough opening for transferring signals therethrough. A sleeve of zirconium alloy or titanium alloy or other corrosion resistant, high strength material having a top and a bottom, the bottom is coupled to the base at or about welding flange. A sensor comprising a protector plate is disposed at the top, wherein the protector plate supporting an affixed piezoelectric plate, such that a cavity is formed between the base and the protector plate. Preferably, the sensor comprises a composite acoustic wave device as described herein. In the preferred embodiment of this embodiment, the base comprises KOVAR®. Most preferably the base and the sleeve are welded together, and thus compatible materials are desired.

SHORT DESCRIPTION OF DRAWINGS

The summary above, and the following detailed description will be better understood in view of the enclosed drawings which depict details of preferred embodiments. It should however be noted that the invention is not limited to the precise arrangement shown in the drawings and that the drawings are provided merely as examples.

FIG. 2 further uses a single transducer for illustrative purposes, but the use of a plurality of transducers is preferred.

DETAILED DESCRIPTION

The following is a description of exemplary preferred embodiments and several modifications thereof. The description provided comes by way of illustrative example only, and the skilled in the art will recognize that many other variations are viable and equivalent to the disclose examples and embodiments. The invention extends to all such equivalents and obvious modifications.

Figure 1:
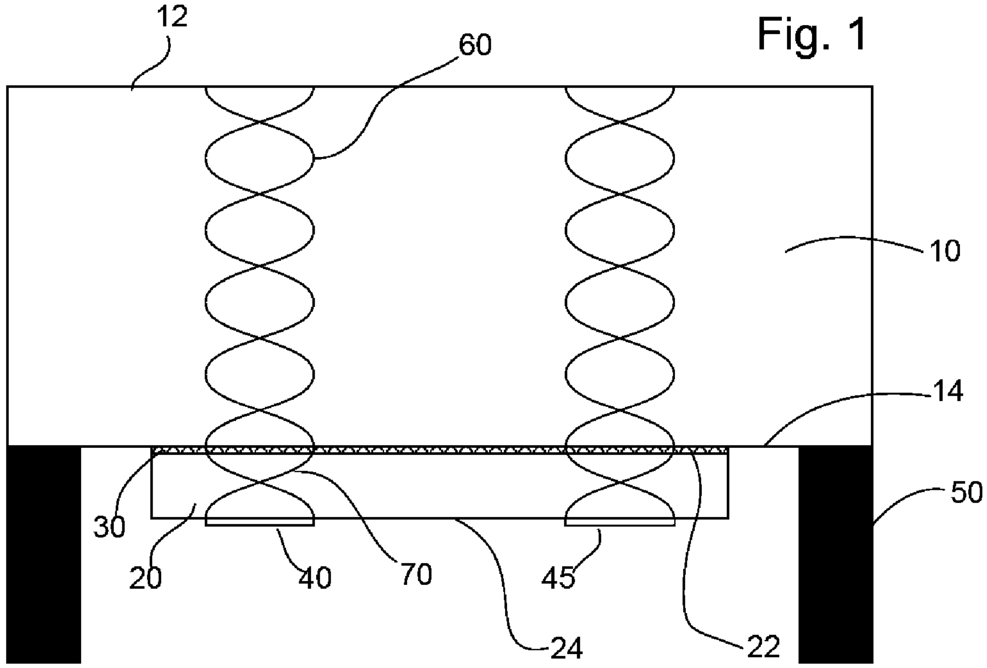
FIG. 1 depicts a cutout of a piezoelectric device constructed in accordance with the preferred embodiment.

FIG. 1 depicts a cutout of an acoustic device in accordance with the preferred embodiment of the invention. Protector plate 10 is coupled to a piezoelectric plate 20 so as to provide substantially continuous phase relationship at the interface therebetween. The protector plate has a driven face 14, and an opposing loaded face 12. When operational, the loaded face will be immersed in the environment to be sensed. The driven face 14 interfaces with a driving face 22 of the piezoelectric plate, and receives acoustic energy therefrom. The ideal boundary conditions between two rigidly bonded materials require that the phase and amplitude of the motion of the two materials be equal (inseparable bond) and that the components of stress perpendicular to the boundary be continuous. These conditions may be closely satisfied through materials selection, through geometrical design, or by having weakly coupled standing waves on either side of the boundary. Clearly, if a bonding material is present, it is desired to further consider its thickness in relations to the desired wave propagation. Such consideration concerns physical properties such as wave propagation speed, thermal expansion coefficients, thickness, and the like, and are well established in the art.

To improve upon the low electrical efficiency of a thick piezoelectric plate operating in overtone mode, it is desired to decouple the mechanical thickness from the 'electrical thickness', the electrical thickness being the thickness that determines the frequency of peak electrical efficiency, the coupling between electrical and mechanical energy, and the input impedance of the device. Decoupling the physical thickness from the electrical thickness implies that when coupled to electrical driving and/or sensing circuitry, the composite device will have electrical properties substantially similar to a relatively thin piezoelectric plate at and near the target resonant frequency, while enjoying the added mechanical strength and/or chemical resistance offered by the addition of the protector plate.

It is desired to eliminate, or at least minimize, wave reflection at the energy interface between the protector and piezoelectric plates. Therefore, acoustically and physically compatible materials are selected for the piezoelectric and protector plate. Dimensioning the piezoelectric plate at or about a requisite multiple of half wavelength, and dimensioning the protector plate at any desired multiple of half wavelength, shall cause the desired standing wave resonance profile. For parallel plate (thickness field) excitation in the piezoelectric plate, the thickness is preferably an odd multiple of the half wavelength whereas for coplanar plate (lateral field) excitation any multiple is allowed. It is further noted that the wavelengths in the piezoelectric plate and the protector plate may differ since the frequency is a constant throughout whereas velocities of sound are material dependent.

Figure 3:
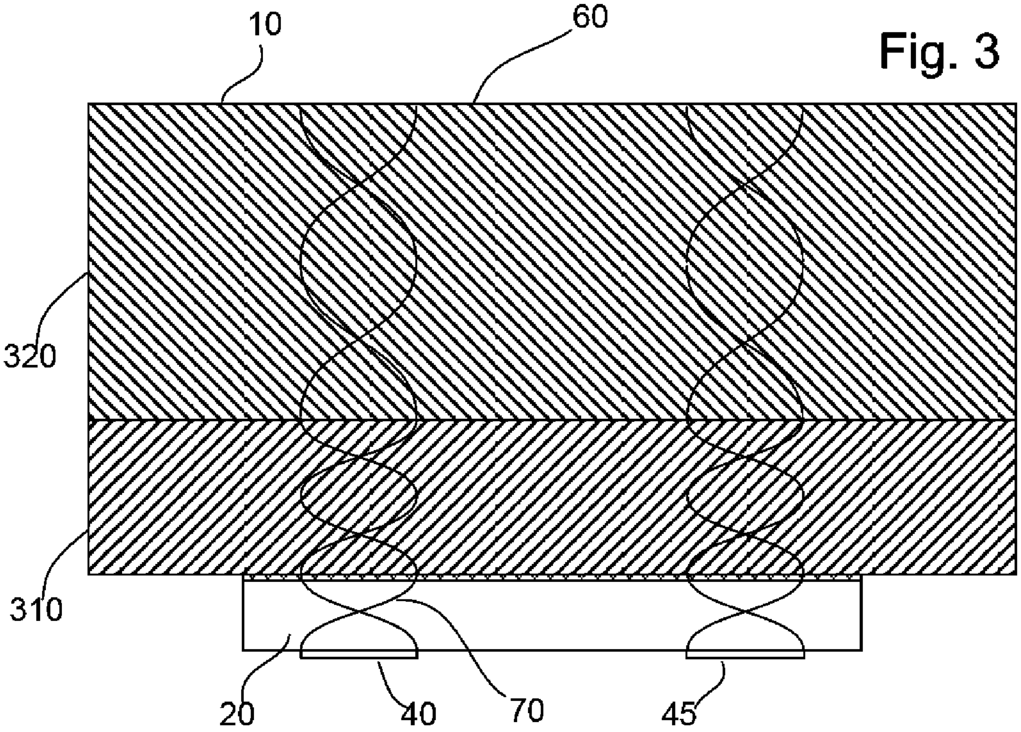
FIG. 3 depicts a general schematic diagram of an embodiment using an optional composite protector plate.
Figure 4:
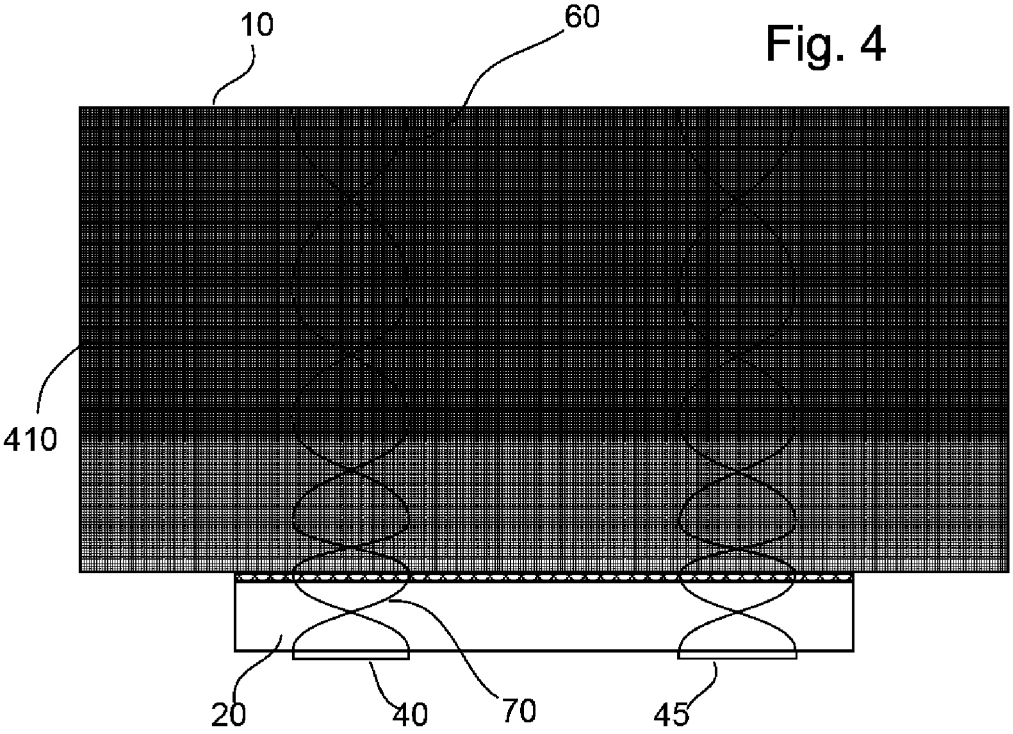
FIG. 4 depicts a general schematic of an embodiment using a functionally graded material protector plate.

It is further noted that the protector plate may be a composite or functionally graded material having spatially dependent velocity and that the phase condition represents the integral phase shift across the protector plate expressed in wavelengths. The term 'composite protector plate refers to a protector plate having at least two separate acoustic materials 310 and 320 as illustrated in FIG. 3, wherein the wavelength in each material differ, but wherein the total thickness and composition of the protector plate is selected to provide the desired acoustic impedance match at the energy interface and the desired reflection at the loaded face. In one such example, a region 320 of higher impedance, high strength material is to be bonded to a low impedance piezoelectric plate 20 but fails to meet the acoustic impedance match conditions. Such a combination is enabled using a composite protector plate having impedance matching regions. By way of non-limiting example, the additional region of the protector plate 310 is nominally an odd multiple of λ/4 thick with an impedance selected to form an anti-reflective layer between the high strength region 320 and the piezoelectric plate 20. In addition to composite layered materials there exist functionally graded materials 410 in which an alloy or mixture continuously varies from one composition (e.g. zirconium) to another (e.g. titanium), offering a continuity of local acoustic impedance and thermal expansion coefficient having one set of properties at the driven face and another at the loaded face.

Physical characteristics of the protector plate are selected to provide the desired physical properties that will protect the rest of the device form the intended harsh environment. Thus for example, when the device is intended for high pressure environments, the yield stress, tensile strength and shear strength of the protector material will be primarily considered, while if the intended environment is chemically hostile, a material resistant to such chemical conditions shall be selected. So by way of example, the protector plate may be made of zirconium, to provide high pressure and chemical corrosive resistance, while in another application aluminum may provide sufficient protection from pressure while offering a less expensive sensor, and in yet another application a titanium alloy may offer exceptionally high tensile strength. Similarly, if the environment is abrasive, a diamond like carbon (DLC) coating may be incorporated into a composite layered protector plate to provide protection against abrasive environments.

The protector plate is supported by a mount 50 that is preferably a part of a packaging 55 for the device. The packaging provides an inside cavity for electrical connections, and optionally for electronic circuitry. In most cases the mounting is achieved by bonding the protector plate to the packaging, so as to provide a hermetical seal. By way of example, low cost packaging might employ Kovar® alloy whereas high strength packaging might employ titanium alloy seamless tubing.

A piezoelectric plate 20 is coupled to the driven face 14 of the protector plate, and is supported therefrom. The zone adjoining the piezoelectric plate and the protector plate forms an energy interface. The piezoelectric plate has a driving face 22 which is used both to provide the mechanical connection to carry the piezoelectric plate 20, and to impart acoustic energy to the protector plate 10. Opposite the driving face 22, the piezoelectric device has an excitation face 24. The excitation face has at least one transducer 40 which imparts acoustic waves in the composite device. In the case of bulk waves, as in the preferred embodiment, the excitation technically occurs within the piezoelectric plate; however the notation of an excitation face denotes the face at which electrical connections are made for the excitation.

The preferred embodiment uses two parallel plate transducers formed between a return electrical contact of the protector plate 10 and electrodes 40 and 45 respectively, one acting as an input transducer and the other as an output transducer. The parallel plate transducers apply and detect electric fields through the thickness of the plate relative to a conductive medium at the zone adjoining the piezoelectric plate and the protector plate that most preferably consists of the protector plate itself. This thickness field excitation is the most preferred embodiment due to the typically higher piezoelectric efficiency. Alternately coplanar electrodes can excite and detect acoustic signals using tangential electric fields (lateral field excitation) and are explicitly considered herein.

The protector plate is made of a high acoustic quality material, such as by way of example, zirconium and its alloys, aluminum and its alloys, single crystals, and other fine-grained elastic materials having sufficiently small plastic flow and inter-grain friction to allow freely propagating acoustic waves at the desired frequency. Moreover, the protector plate material is selected to have substantially similar temperature coefficient of expansion as the piezoelectric plate, so as to minimize stress at the energy interface. The protector plate is preferably chosen to have acoustic impedance of the desired wave mode substantially equal to that of the piezoelectric plate. Matching acoustic impedances between the two materials eliminates, or at least minimizes, reflections of energy transmitted therebetween and allows a single wave resonance to exist throughout the composite device while satisfying the continuity of motion and stress.

Other material characteristics may also lend a specific material to specific application. By way of example, zirconium has good yield stress, carbides and nitrides easily and is thus easily passivated, and is easily weldable to titanium and steel. Therefore zirconium will fit especially well to high pressure applications. Aluminum is inexpensive, presents high corrosion resistance after passivation, good heat conduction, and offers an excellent strength to weight ratio. Thus aluminum will fit well to applications where low cost and light weight are required.

Figure 5:
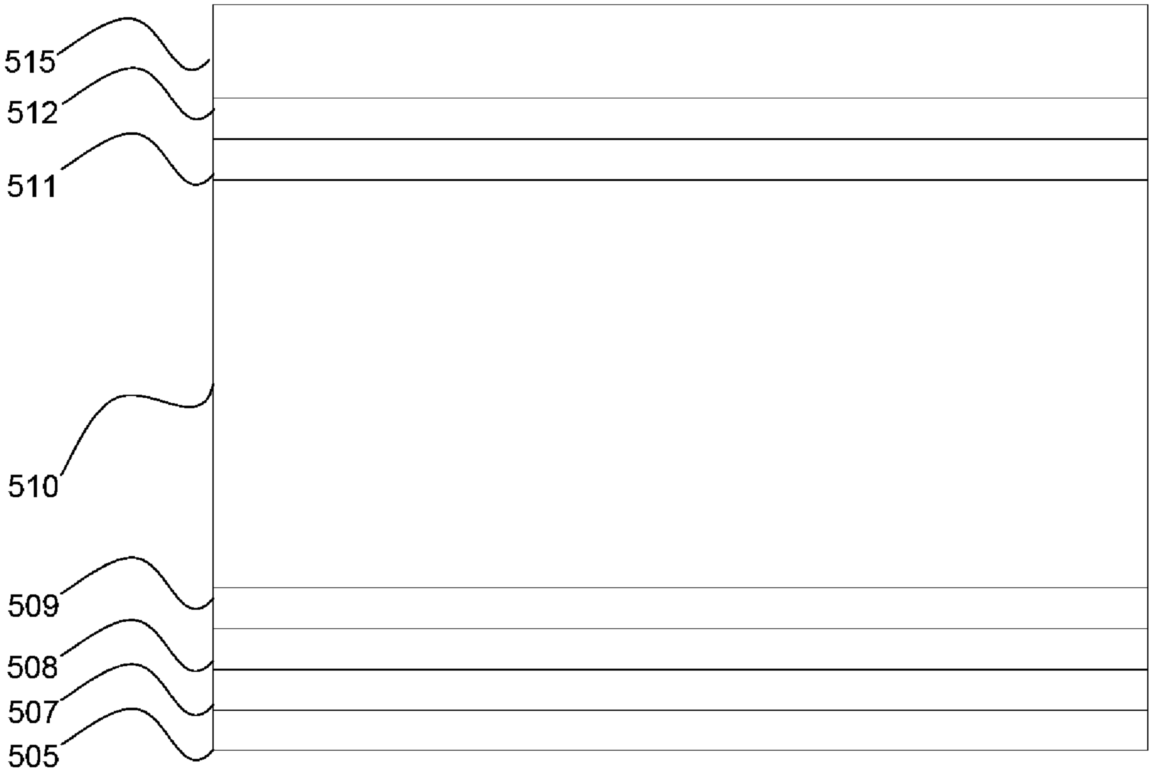
FIG. 5 depicts several optional construction details of a protector plate.

Furthermore, the protector plate may comprise a plurality of materials to achieve a desired set of characteristics. Thus, as depicted by way of example in FIG. 5, a protector plate may be constructed of a zirconium alloy plate 510 and coated on the driven surface with a series of adhesion and barrier metals 509, 508, and 507, so as to be more compatible with a bonding layer 505 that affixes the protector plate to the piezoelectric plate. The loaded face may be coated with one or more layers, 511 and 512, adapting the zirconium alloy to the covalent attachment of a polymer or bioreceptor film 515, (sensing film) or a diamond-like carbon protective layer. The entire composite protector plate from the adhesion and the barrier metals 507-509 to the sensing film or protective coating 515 represents a composite protector plate.

The piezoelectric plate is preferably made of piezoelectric material having good piezoelectric efficiency and having thermal expansion coefficients and acoustic impedance suitably matched by an adequate protector plate. By way of example, gallium phosphate, lithium niobate (LNB), lithium tantalate (LTA), strontium tantalum gallium silicate (STGS), and quartz (QTZ) all have large directional dependencies of their thermal expansion coefficients such that the traditional rotated Y-cuts associated with thickness field excitation of thickness shear mode sensors are unable to be matched by a protector plate over any meaningful temperature range. Furthermore since most joining processes involve thermal cure or melting processes, these materials are difficult to process. Other materials such as aluminum nitride (AlN), strontium niobium gallium silicate (SNGS), lanthanum gallium silicate (LGS), lanthanum gallium niobate (LGN), and lanthanum gallium tantalate (LGT) offer similar expansion coefficients in different directions. A family of materials based on Calcium "X" "Y" silicate, where "X" is niobium or tantalum and "Y" is gallium or aluminum (CNGS, CTGS, CNAS, CTAS) also offer promise and preliminary data suggests they are suitable replacements for LGS. The strontium derivatives, strontium XY silicate other than STGS also appear to offer attractive properties. Preferred materials for the piezoelectric plate include the likes of LGS, LGN, LGT, SNGS, SNAS, STAS, CTGS, CNGS, CTAS, and CTGS. The most preferred embodiment to date utilizes LGS, but quartz, aluminum phosphate and the like may also be employed.

It is important to realize that the piezoelectric material is mechanically supported by the protector plate, as that plate provides the piezoelectric plate with the protection required from the measurand, as well as acting as a part of the composite AWD. This mechanical connection may be achieved by several ways such as welding, bonding, or possibly even epitaxial crystal growth, with bonding being the preferred mode as discussed below.

As stated above it is desired to decouple the mechanical thickness from the electrical thickness. The skilled in the art will recognize that the piezoelectric plate by itself defines an inherent resonant frequency. This resonant frequency will be used as the reference point. Decoupling the electrical thickness from the mechanical thickness implies causing the composite device of at least the piezoelectric plate and the protector, as well as the bonding layer, if one is present, to act electrically as if only the piezoelectric plate is present at least at or near the frequency of series resonance.

To that end, the piezoelectric plate thickness is set at, or close to, an odd multiple of half wavelength of the resonant frequency $t_{piez}$~$(2m-1)*(\lambda_{piez}/2)$, where m is any positive integer, and $\lambda_{piez}$ is the resonant frequency wavelength in the piezoelectric material. In the preferred embodiment, the multiple m is a unity, i.e. the piezoelectric plate thickness $t_{piez}=\lambda_{piez}/2$. It is reiterated that the requirement for an odd multiple is specific to thickness field excitation and that lateral field excitation might allow any multiple of $\lambda_{piez}/2$.

In order to provide the least perturbation of the piezoelectric plate, the protector plate thickness, $t_{prot}$, is a positive integer multiple of $\lambda_{prot}/2$ where $\lambda_{prot}$ is the wavelength in the protector plate material at the resonant frequency of the piezoelectric plate in isolation. Note that if the protector plate is a composite of several materials, and/or there is a bonding medium, the condition is that the sum of the phase shifts through the constituent materials is close to a multiple of $\pi$ radians. An analogy to lossless transmission line theory will reveal that the acoustic impedance seen at the input of a $\lambda/2$ long transmission line is simply the impedance present at the opposite end of the transmission line. Therefore, in the limit of low losses, the device behaves as though there were no protector plate for a narrow range of frequencies.

This allows a relatively high thickness of the protector plate, if the desired protection is against high pressure. If the desired protection is against a harsh chemical environment, a single half wavelength protective device may provide a less expensive yet sufficiently protected device.

As acoustic propagation speed in the protector and piezoelectric materials may differ, it is realized that the thickness is relative to the wave propagation, and thus the wavelength in each medium at the target resonant frequency. Similar considerations are preferably accorded to the bonding layer 30 if it is acoustically significant. It will also be clear to the skilled in the art that taking into consideration the acoustic impedance of the bonding layer, as well as its physical thickness, will provide a better performing device, as disclosed by Hickernell, "The Characterization of Permanent Acoustic Bonding Agents" Fred S. Hickernell (University of Arizona, Tucson, Ariz., USA, University of Central Florida, Orlando, Fla., USA) 2008 IEEE Frequency Control Symposium Proceedings (in press).

This structure provides for an acoustic wave 70 propagated in the piezoelectric plate to have substantially continuous displacement relationship with the acoustic wave 60 propagated in the protector plate. Most preferably the impedances match, allowing the phase to also be continuous without recourse to reflected or refracted waves. The acoustic impedance of a wave with phase velocity, V, and material mass density, $\rho$, is simply $V\rho$. The reflection coefficient magnitude between two media is $$|\Gamma|=|(V_1\rho_1-V_2\rho_2)/(V_1\rho_1+V_2\rho_2)|$$

and is typically reported as a return loss in dB as $-20*\log_{10}(|\Gamma|)$. High return losses indicate low reflections and good acoustic match. A value of 20 dB corresponds to a linear magnitude of 0.1 for the reflection coefficient and is considered a good match for the purposes of this embodiment.

The specification of a resonant frequency in the piezoelectric presupposes the selection of one of three possible acoustic waves that might propagate between the excitation face of the piezoelectric and the sensing face of the protector plate. In an isotropic material such as a metal alloy, there exists one compressional wave having acoustic displacements parallel to the direction of wave propagation and two identical shear waves having displacements perpendicular to the direction of propagation. These shear waves therefore have propagation perpendicular to the surfaces and acoustic displacements that lie in the surface. Such motion is highly desirable for sensing in fluid environments. The more general case of the piezoelectric material presents three allowed modes. One is predominantly compressional and the remaining two are predominantly shear. Proper design of the invention recommends the crystal be cut in a plane where the desired acoustic mode is either purely shear or purely compressional to allow proper matching across the energy interface.

While in an HBAR the desire is to create a highly frequency selective unloaded resonator, which is clearly unfit for sensor operations, the present invention relates to moderate frequency selectivity in loaded operation. The high Q frequency selectivity of the HBAR is achieved by the use of high overtone mode, typically in the range of several hundreds, The present invention maintains operation at moderate overtone, typically in the several tens range, and thus is less frequency selective and more suitable for loading for sensor operation.

In the preferred embodiment, the piezoelectric plate is coupled to the protector plate by a bonding layer 30. The bonding layer is rigid, and utilizes a material having high acoustic quality. High acoustic quality relates to a well-known intrinsic property of a material. Acoustic quality (Q) is the ratio of elastically stored energy per unit volume to the dissipated power per unit volume. For a traditional viscoelastic material with complex elastic constant, $\mu=\mu_o+j\omega\eta$, at radian frequency, $\omega$, the Q is the ratio of the true elastic constant to the frequency-viscosity product, $\mu_o/\omega\eta$. High acoustic quality materials therefore have low internal losses (e.g. viscosity). Other loss mechanisms such as Rayleigh scattering from inter-grain boundaries, have different math but similar result.

If the thickness of the bonding layer is significant, acoustic propagation therein should be considered when selecting the thickness of the protector and/or piezoelectric plate. The most preferred embodiment calls for an acoustically insignificant bonding layer of high acoustic quality and high tensile adhesion strength. By way of example in the preferred embodiment methyl-silsesquioxane "spin on glass", or bismuth-zinc-boron glass may serve as a bonding layer when the protector plate is made of a fine grained zirconium alloy and the piezoelectric plate is made of LGS. The aforementioned materials require bonding temperatures from 260° C. to 500° C., suggesting excellent thermal match of the expansion of the two plates is required. Methyl methacrylate and other adhesives are applicable at low frequencies and successful devices bonding quartz and aluminum are demonstrated. The skilled in the art will be readily capable of determining the bonding layer properties required to provide compatibility with the protector and piezoelectric plates, and select or develop the required material, according to the leading requirements of acoustic quality, thermal expansion coefficient, adhesion, and the like, as discussed herein.

The preferred bonding layer is rigid, and provides high acoustic quality. It must provide an interface through which the acoustic energy may travel without materially dissipating that energy on elastic losses or heat. Examples of materials suitable for the bonding include amongst others, amorphous or glassy materials capable of melting at a sufficiently low temperature and then solidifying in the vitreous state and fine-grained eutectic solders with low incidences of large intermetallic grains. Lead based glasses are historically favored but are being eliminated due to environmental concerns with replacements based on bismuth-boron-zinc oxides and other phosphate and borosilicate glasses. Gold tin solder has a complex intermetallic system but can be acceptable at the eutectic mixture. Lower melting alloys are known but may remelt in use and higher melting alloys make the degree of thermal expansion match more constrained, and thus are more suitable for low temperature applications.

In certain embodiments, it is desirable to use bonding layer 30 as an electrode, such as a grounding electrode. By way of example a single crystal or glass protector plate might be coated with titanium-platinum-gold and then gold-tin soldered to a similar metal layer on the piezoelectric plate. This multi-layered metallic bonding layer may be acoustically insignificant and still provide the requisite ground electrode for thickness field excitation. Similarly evaporated coatings on the two materials may be melted or diffusion bonded together to join the plates and be sufficiently conductive to serve as the grounding electrode. It is noted that the electrode need not be "grounded" and the terminology reflects one traditional manner of describing such devices.

As described above, mechanical and electrical characteristics matching is important for satisfactory operation of the device. Certain preferred material combinations are disclosed herein by way of example. The combination of zirconium based protector plate and a langasite family (LGS, LGN, LGT, CTGS, CNGS, CTAS, CNAS, SNGS, STGS, and related materials) based piezoelectric plate provides an excellent match for many applications. Similarly, the combination of an aluminum based protector plate and a quartz family based piezoelectric plate provide another good combination, as do aluminum nitride and sapphire. The skilled in the art will have no difficulty combining materials in such a way that will provide a good match in terms of acoustic impedance, temperature coefficient, and mechanical characteristics as well. However table 1 is provided to assist the skilled in the art to develop a suitable alloy, and depicts match (in dB) as return loss magnitude between various rigid structural materials and various piezoelectric materials. High numbers indicate a good match. Estimated data for CTAS, CTGS, and STGS is based on unit cell dimensions, molar mass, and interpolation. It is readily apparent that the metals titanium, zirconium, vanadium, niobium and hafnium offer a good acoustic match to the LGS family.

An aspect of the present invention provides a composite acoustic wave device for sensor or excitation applications, having a langasite family piezoelectric plate having a thickness of substantially an odd multiple of half-wavelengths, rigidly bonded to a plate of zirconium alloy having a thickness of substantially a multiple of half-wavelength. Such composite AWD will exhibit good mechanical stability and yield stress, and a relatively inert material at the sensing face. The skilled in the art will readily understand that while these specifications describe the dimensions, wave behavior, electrical and acoustic impedance, and the like, in a manner that is considered ideal, physical or design limitations may dictate diversions therefrom. Thus, by way of example, while an ideal device according to the invention calls for completely continuous displacement phase and peak amplitude at the energy interface or at the excitation or loaded faces, a certain phase and/or amplitude difference in some cases as much as 15 or even 30 degrees, may provide substantially similar results within the desired context. Thus, the invention extends to substantially similar conditions, materials, and the like, as depart from the ideal conditions disclosed above.

Another aspect of the invention relates to the packaging of a piezoelectric or similar sensor.

KOVAR (trademark of Carpenter Technology Corporation) is a ferrous nickel cobalt alloy commonly used in electronic packaging as it was designed to offer a temperature expansion coefficient substantially similar to that of silicon and matching borosilicate glass over a wide temperature range. However KOVAR is often incompatible with harsh environments, and offers limited strength to high pressure, immersion in salts, strong acids, and strong alkali, and the like. Therefore, there is a need for a packaging better suited for sensor and other applications requiring exposure to such environments. Thus this aspect of the invention provides such packaging.

Figure 2:
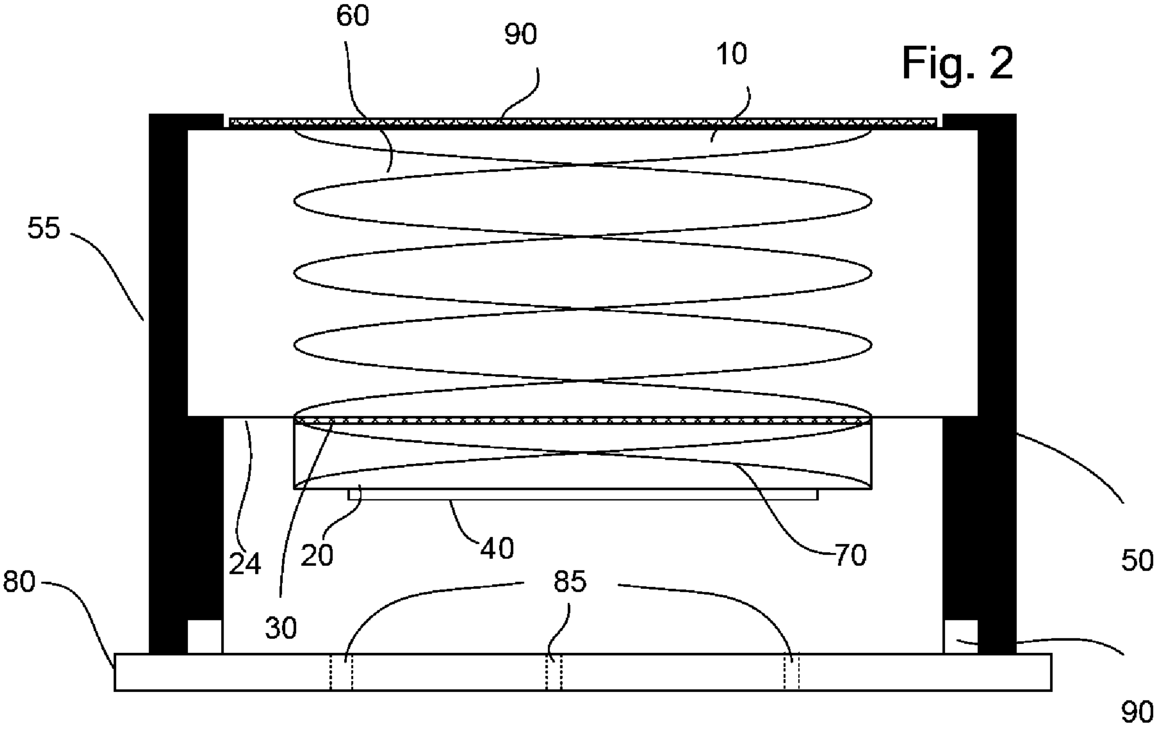
FIG. 2 depicts a cutout of another embodiment in accordance with the invention, enclosed in packaging suitable for high pressure.

Referring now to FIG. 2, there is shown an embodiment of the sensor described above. This embodiment uses a single transducer 40 deposited on the excitation face 24, and the bonding layer 30 acts as a return electrode. A KOVAR base 80 has at least one, and preferably a plurality of holes 85 therein for allowing passage of connection wires through borosilicate seals (not shown). The KOVAR base has an optional welding flange 90. A zirconium or titanium sleeve with a top and a bottom is welded to the base, most preferably at the welding flange. Titanium is most preferred due to its extremely high tensile strength.

The location of the return electrode is a matter of technical choice, and while the location between the protector plate and the piezoelectric plate is most preferred for thickness field excitation, other locations will be clear to the skilled in the art so as to respond to specific application requirements, such as, by way of example, a lateral field excitation in which the return electrode is coplanar with the input and output electrodes.

A protector plate, preferably comprising a zirconium alloy, but optionally any material weldable to the sleeve and meeting the other requirements disclosed above, is disposed at the top of the sleeve.

Thus the zirconium or titanium sleeve provides excellent pressure and chemical protection to the internal cavity formed over the KOVAR base. Such construction allows placing silicon based circuitry close to the sensor or delicate metal electrodes upon the sensor, while still providing excellent protection from harsh environments.

It will be appreciated that the invention is not limited to what has been described hereinabove merely by way of example. While there have been described what are at present considered to be the preferred embodiments of this invention, it will be obvious to those skilled in the art that various other embodiments, changes, and modifications may be made therein without departing from the spirit or scope of this invention and that it is, therefore, aimed to cover all such changes and modifications as fall within the true spirit and scope of the invention, for which letters patent is applied.

TABLE 1

| MATERIALS | P.M. | AT-QTZ | Y-CNGS | Y-CTAS | Y-CTGS | Y-LGS | Y-LGT | Y-LGN | Y-SNGS | Y-STGS | X-AIN | X-LNB | X-LTA |
|---|---|---|---|---|---|---|---|---|---|---|---|---|---|
| R.S.M | ZA | 8.8 | 12.9 | 14 | 14.6 | 15.7 | 16 | 16 | 16.9 | 17.7 | 20.3 | 20.7 | 27.6 |
| fused quartz | 8.3 | **30** | 13 | 12 | 11 | 10 | 10 | 10 | 9 | 9 | 8 | 7 | 5 |
| aluminum | 8.4 | **32** | 13 | 12 | 11 | 10 | 10 | 10 | 9 | 9 | 8 | 7 | 5 |
| scandium | 9.3 | **31** | 16 | 14 | 13 | 12 | 12 | 12 | 11 | 10 | 9 | 8 | 6 |
| Tin | 9.5 | **29** | 16 | 14 | 13 | 12 | 12 | 12 | 11 | 10 | 9 | 9 | 6 |

TABLE 1-continued

| MATERIALS | P.M. | AT-QTZ | Y-CNGS | Y-CTAS | Y-CTGS | Y-LGS | Y-LGT | Y-LGN | Y-SNGS | Y-STGS | X-AIN | X-LNB | X-LTA |
|---|---|---|---|---|---|---|---|---|---|---|---|---|---|
| silicon | 9.7 | **27** | 17 | 15 | 14 | 12 | 12 | 12 | 11 | 11 | 9 | 9 | 6 |
| quartz | 10.3 | **22** | 19 | 16 | 15 | 14 | 13 | 13 | 12 | 12 | 10 | 9 | 7 |
| titanium | 14.1 | 13 | **27** | **51** | **35** | **25** | **24** | **24** | **21** | 19 | 15 | 14 | 10 |
| Vitralloy | 14.6 | 12 | **24** | **33** | **68** | **29** | **27** | **27** | **23** | **20** | 16 | 15 | 10 |
| Zr-705 | 15.1 | 12 | **22** | **28** | **35** | **35** | **31** | **31** | **25** | **22** | 17 | 16 | 11 |
| Zr-704 | 15.2 | 12 | **22** | **28** | **35** | **35** | **31** | **31** | **25** | **22** | 17 | 16 | 11 |
| Ti—45Nb | 15.3 | 11 | **21** | **27** | **33** | **38** | **33** | **33** | **26** | **23** | 17 | 16 | 11 |
| Zr-702 | 15.4 | 11 | **21** | **27** | **32** | **39** | **34** | **34** | **26** | **23** | 17 | 17 | 11 |
| langasite | 15.6 | 11 | **21** | **26** | **30** | **47** | **37** | **37** | **28** | **24** | 18 | 17 | 11 |
| Vanadium | 16.8 | 10 | 18 | 21 | 23 | **29** | **32** | **32** | **55** | **32** | **21** | **20** | 12 |
| Niobium | 18.0 | 9 | 16 | 18 | 20 | **23** | **24** | **24** | **30** | **40** | **25** | **23** | 14 |
| Pd40Ni40P20 | 18.5 | 9 | 15 | 17 | 18 | **22** | **23** | **23** | **27** | **33** | **27** | **25** | 14 |
| Hafnium | 20.0 | 8 | 13 | 15 | 16 | 18 | 19 | 19 | **22** | **24** | **42** | **35** | 16 |
| C-103 | 20.2 | 8 | 13 | 15 | 16 | 18 | 19 | 19 | **21** | **24** | **54** | **39** | 16 |
| kovar | 20.8 | 8 | 13 | 14 | 15 | 17 | 18 | 18 | **20** | **22** | **38** | **53** | 17 |
| gold | 22.8 | 7 | 11 | 12 | 13 | 15 | 15 | 15 | 17 | 18 | **25** | **26** | **21** |
| SiC | 23.8 | 7 | 11 | 12 | 12 | 14 | 14 | 14 | 15 | 17 | **22** | **23** | **23** |
| sapphire | 24.1 | 7 | 10 | 12 | 12 | 13 | 14 | 14 | 15 | 16 | **21** | **22** | **23** |
| nickel | 26.0 | 6 | 9 | 10 | 11 | 12 | 12 | 12 | 13 | 14 | 18 | 19 | **31** |
| chrome | 28.7 | 6 | 8 | 9 | 10 | 11 | 11 | 11 | 12 | 13 | 15 | 16 | **35** |
| tantalum | 33.9 | 5 | 7 | 8 | 8 | 9 | 9 | 9 | 10 | 10 | 12 | 12 | **20** |
| molybdenum | 35.1 | 4 | 7 | 7 | 8 | 8 | 9 | 9 | 9 | 10 | 11 | 12 | 18 |

What is claimed is:

1. A composite acoustic wave device having a target resonant frequency, associated with a selected polarization of acoustic displacement, the device comprising:

a rigid protector plate mounted to a mechanical mount, said protector plate comprising a material having high quality acoustical characteristics, said protector plate having a driven face and a sensing face, and further having a thickness which is substantially a multiple of half wavelength of said resonant frequency;

a piezoelectric plate having a thickness of substantially a multiple of half wavelength of said resonant frequency in said plate, said piezoelectric plate having an excitation face having at least one transducer electrode deposited thereupon;

said electrode and at least one other electrode forming a transducer interconverting electrical and acoustical energy within said piezoelectric plate;

said piezoelectric plate being supported from said protector plate forming an energy interface between said driven face and a driving face of said piezoelectric plate;

said protector plate having an acoustic impedance substantially equal to the impedance of the piezoelectric material;

such that a wave of said resonant frequency traveling between said excitation face and said sensing face, shall form a substantially continuous-phase wave, at substantially peak displacement amplitude, at the energy interface.

2. A composite acoustic wave device as claimed in claim 1, wherein said piezoelectric plate has a thickness of substantially one half wavelength of said resonant frequency.

3. A composite acoustic wave device as claimed in claim 1, wherein said protector plate is made of material selected from a group consisting of Zirconium, Zirconium alloys, aluminum, aluminum alloys, niobium, niobium alloys, vanadium, and vanadium alloys.

4. A composite acoustic wave device as claimed in claim 1 wherein the selected acoustic displacements are tangential to the sensing surface.

5. A composite acoustic wave device as claimed in claim 4, wherein said protector plate comprises one or more layers or regions comprising an alloy having at least 50% zirconium, and wherein said piezoelectric plate comprises material selected from a group consisting of LGS, LGN, LGT, CNGS, CTGS, SNGS, STGS, CTAS, CNAS, and any combination thereof.

6. A composite acoustic wave device as claimed in claim 5, wherein said protector plate comprises one or more layers or regions having a zirconium alloy comprising between 0 and 10% niobium and between 0 and 10% hafnium.

7. A composite acoustic wave device as claimed in claim 4, wherein said protector plate comprises aluminum, and said piezoelectric plate comprises quartz.

8. A composite acoustic wave device as claimed in claim 4, wherein the acoustic impedance of said protector plate and said piezoelectric plate is sufficiently matched so as to allow a reflection coefficient of less than 10% at the energy interface.

9. A composite acoustic wave device as claimed in claim 4, further comprising a bonding layer disposed between said protector plate and said piezoelectric plate.

10. A composite acoustic wave device as claimed in claim 4, wherein said protector plate comprises a composite of a plurality of materials.

11. A composite acoustic wave device as claimed in claim 10, wherein said composite protector plate has impedance matching regions.

12. A composite acoustic wave device as claimed in claim 4, wherein said protector plate comprises one or more layers or regions comprising an alloy having at least 50% in the aggregate of niobium and vanadium combination, and wherein said piezoelectric plate comprises material selected from a group consisting of LGS, LGN, LGT, CNGS, CTGS, SNGS, STGS, CTAS, CNAS, and any combination thereof.

13. A composite acoustic wave device as claimed in claim 1, wherein said peak displacement amplitude is within λ/12 from said energy interface.

14. A composite acoustic wave device as claimed in claim 1, wherein said peak displacement amplitude is within λ/24 from said energy interface.

15. A composite acoustic wave device as claimed in claim 1, wherein the acoustic impedance of said protector plate and said piezoelectric plate is sufficiently matched so as to allow a reflection coefficient of less than 10% at the energy interface.

16. A composite acoustic wave device as claimed in claim 1, further comprising a bonding layer disposed between said protector plate and said piezoelectric plate.

17. A composite acoustic wave device as claimed in claim 1, wherein said protector plate comprises a composite of a plurality of materials.

18. A composite acoustic wave device as claimed in claim 17, wherein said composite protector plate has impedance matching regions.

19. A composite acoustic wave device as claimed in claim 1 wherein said protector plate comprises material with continuously varied acoustic impedance.

20. An electronic package for placing a sensor in harsh environments, the package comprising:

a base having a welding flange, said base having at least one electrical feedthrough opening for transferring signals therethrough;

a zirconium alloy or titanium alloy sleeve having a top and a bottom, said bottom being coupled to said base at or about said welding flange;

a sensor comprising a protector plate disposed at said top;

said protector plate supporting an affixed piezoelectric plate;

such that a cavity is formed between said base and said protector plate.

21. A package as claimed in claim 20, further comprising a composite acoustic wave device having a target resonant frequency, wherein said rigid protector plate is mounted to said sleeve, said protector plate having a driven face and a loaded face, and further having a thickness which is substantially a multiple of half wavelength of said resonant frequency;

wherein said composite acoustic wave device further comprises:

a piezoelectric plate having a thickness of substantially a multiple of half wavelength of said resonant frequency, said piezoelectric plate an excitation face having at least one electrode deposited thereupon;

said piezoelectric plate being supported from said protector plate forming an energy interface between said driven face and a driving face of said piezoelectric plate;

such that a wave of said resonant frequency traveling between said excitation face and said driven face, shall form a substantially continuous-phase wave, at substantially peak amplitude, at the energy interface.

22. A package as claimed in claim 20, wherein said base comprises KOVAR, and wherein said sleeve is coupled to said base by welding.

* * * * *